(12) United States Patent
Jaccard et al.

(10) Patent No.: US 7,385,209 B2
(45) Date of Patent: Jun. 10, 2008

(54) MICROMACHINING PROCESS, SYSTEM AND PRODUCT

(75) Inventors: Samuel Jaccard, Chamrelien (CH); Serguei Mikhailov, Bôle (CH); Frans Munnik, Le Locle (CH)

(73) Assignee: Haute Ecole Arc Ne-Be-Ju, Neuchatel (CH)

( * ) Notice: Subject to any disclaimer, the term of this patent is extended or adjusted under 35 U.S.C. 154(b) by 310 days.

(21) Appl. No.: 11/256,213

(22) Filed: Oct. 24, 2005

(65) Prior Publication Data
US 2006/0214105 A1 Sep. 28, 2006

Related U.S. Application Data

(63) Continuation-in-part of application No. PCT/EP2004/050610, filed on Apr. 26, 2004.

(30) Foreign Application Priority Data
Apr. 24, 2003 (EP) ................... 03009333

(51) Int. Cl.
*G01N 23/00* (2006.01)
*G21K 7/00* (2006.01)
(52) U.S. Cl. ............... 250/492.21; 250/492.23; 250/492.3; 250/307; 365/106; 430/5; 430/296; 430/396; 430/942
(58) Field of Classification Search ............... None
See application file for complete search history.

(56) References Cited

U.S. PATENT DOCUMENTS

| 5,126,006 A | 6/1992 | Cronin et al. |
|---|---|---|
| 5,730,924 A | 3/1998 | Katoh et al. |
| 5,761,111 A | 6/1998 | Glezer |
| 6,548,224 B1 | 4/2003 | Chen et al. |
| 2002/0006648 A1 | 1/2002 | Goodman et al. |

FOREIGN PATENT DOCUMENTS

| DE | 196 52 463 A1 | 6/1998 |
|---|---|---|
| WO | WO 01/96959 A2 | 6/2001 |

OTHER PUBLICATIONS

T. Osipowicz, J. A. Van Kan, T. C. Sum, J. L. Sanchez, F. Watt, The Use of Proton Microbeams for the Production of Microcomponents, Nuclear Instruments and Methods in Physics Research B 161-163, 2000, pp. 83-89, Elsevier Science B. V., Singapore.

(Continued)

*Primary Examiner*—Jack Berman
*Assistant Examiner*—Zia R. Hashmi
(74) *Attorney, Agent, or Firm*—Blank Rome LLP

(57) ABSTRACT

Ion beam lithography technique wherein a higher amount of radiation energy is deposited to predetermined regions in the bulk if a suitable substrate. By selecting the radiation nature, its energy and the irradiation parameters a structure can be created in the bulk of the material leaving the surface essentially untouched.

26 Claims, 4 Drawing Sheets

OTHER PUBLICATIONS

K. Avary, J. P. Reithmaier, F. Klopf, T. Happ, M. Kamp, A. Forchel, Deeply Etched Two-Dimensional Photonic Crystals Fabricated on GaAs/AlGaAs Slab Waveguides by Using Chemically Assisted Ion Beam Etching, Microelectronic Engineering 61-62, 2002, pp. 875-880, Elsevier Science B. V., Germany.

F. Munnik, F. Benninger, S. Mikhailov, A. Bertsch, P. Renaud, H. Lorenz, M. Gmur, High Aspect Ratio, 3D Structuring of Photoresist Materials by Ion Beam LIGA, Microelectronic Engineering 67-68, 2003, pp. 96-103, Elsevier Science B. V., Switzerland.

S. V. Springham, T. Osipowicz, J. L. Sanchez, L. H. Gan, F. Watt, Micromachining Using Deep Ion Beam Lithography, Nuclear Instruments and Methods in Physics Research B 130, 1997, pp. 155-159, Elsevier Science B. V., Singapore.

Laurent Marot, Frans Munnik, Serguei Mikhailov, Direct Writing of Microtunnels Using Proton Beam Micromachining, Applied Surface Science, 2005, pp. 1-4, Elsevier Science B. V., Switzerland.

P. Polesello, C. Manfredotti, F. Fizzotti, R Lu, E. Vittone, G. Lerondel, A. M. Rossi, G. Amato, L. Boarino, S. Galassini, M. Jaksic, Z. Pastuovic, Micromachining of Silicon With a Proton Microbeam, Nuclear Instruments and Methods in Physics Research B 158, 1999, pp. 173-178.

Yvan Gonin, Frans Munnik, Frederic Benninger, Comparison of a New Photoresist (DiaPlate 133) With SU-8 Using Both X-Ray and Ion Beam Lithographies, J. Vac. Sci. Technology B, 2004, pp. 1982-1986, vol. 22, No. 4.

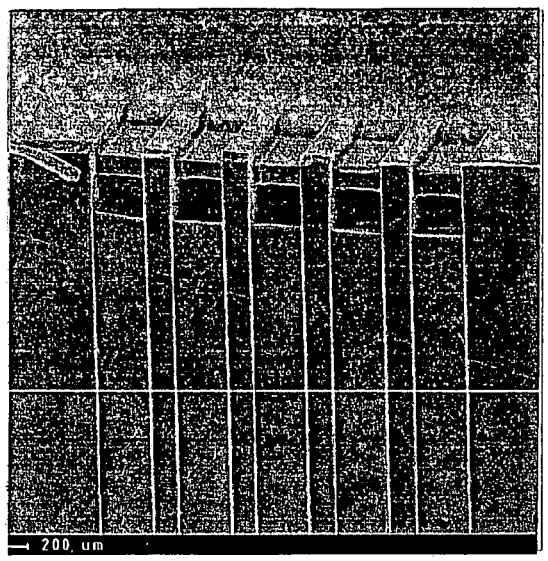
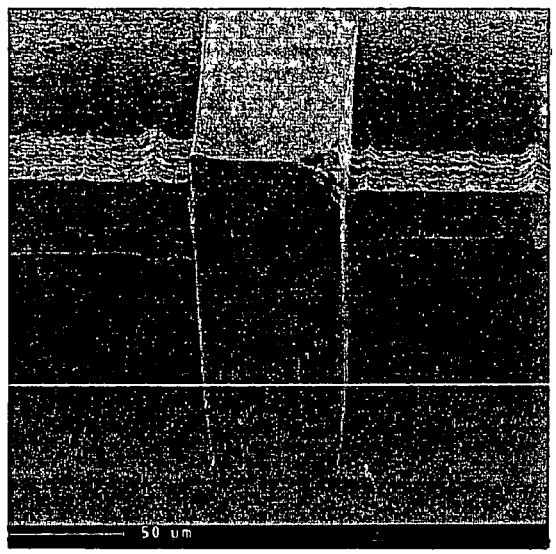
FIG. 5            FIG. 6
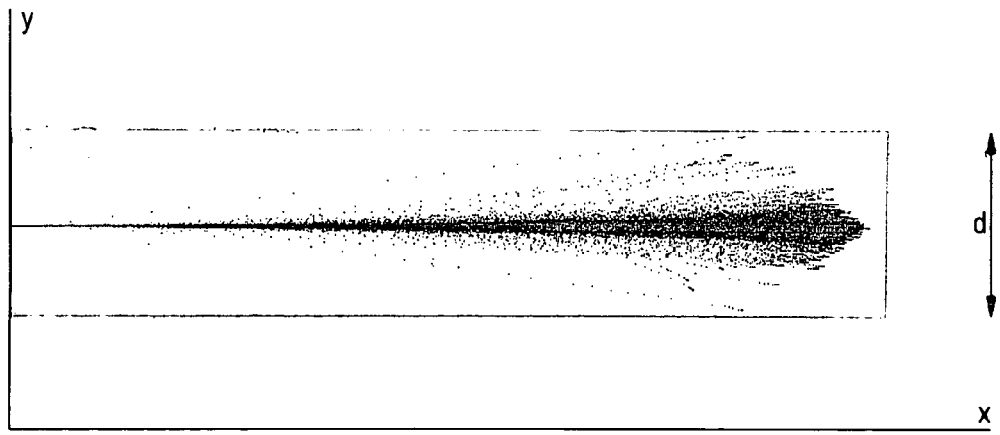
FIG. 7
FIG. 9
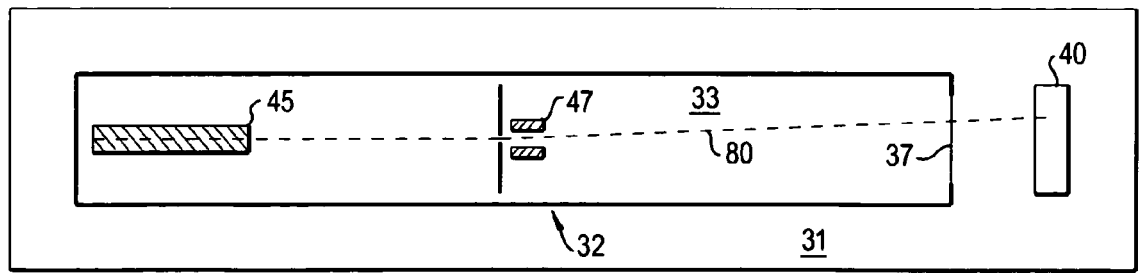

MICROMACHINING PROCESS, SYSTEM AND PRODUCT

REFERENCE DATA

This patent application is a continuation-in-part of international patent application WO04095138, filed on Apr. 26, 2004 and hereby incorporated by reference, which claims priority from European Patent application EP3009333, filed on Apr. 24, 2003 and hereby incorporated by reference.

FIELD OF THE INVENTION

This invention relates to a 3D micromachining lithography process, system and product in which penetrating radiations are used for creating buried structures in the interior of a radiation-sensitive material, or for altering the properties of the material itself. Moreover this invention relates to an irradiation system and process by which a beam of charged particles is directed towards a target in air, or in a suitable process gas.

DESCRIPTION OF RELATED ART

Three-dimensional micromachined components are increasingly required for answering the always growing miniaturization needs of industry. In particular 3D micromachined structures are required for the latest generation of microminiaturized sensor, actuators and fluidic devices. The technology of Micro-electro mechanical systems or MEMS is also growing exponentially and relies on the availability of effective fabrication methods of 3D miniaturized structures.

There is also an increasing need for devices in which the substrate material is not necessarily machined, but rather some relevant property of the material is altered according to a predefined three-dimensional patter on a microscopic scale. For example refraction index or the magnetic properties of the material could be selectively modified. Such devices are especially sought for in optical and data storage application.

Many lithographic techniques exist that can be adapted to produce three-dimensional structures in some material; these techniques however generally fail when deep, high aspect ratio features are required. Among such techniques one can mention the LIGA and X-LIGA processes and the electron beam writing method.

There is an increasing demand from industry for 3D micromachined components and it is expected that this demand will continue to grow exponentially. In the last several years the miniaturisation actuators, sensors, etc. has continued apace. Micro-mechanical components are also increasingly integrated with electronic devices in so-called MEMS (micro-electro mechanical systems).

There are many lithographic techniques around but only a limited number of techniques are able to produce high aspect ratio, very small microstructures needed in the near future. The LIGA process (German acronym for Lithographie, Galvanoformung and Abformung) is one of the processes currently being used to produce microstructures, electron beam writing is another. The types of irradiation for the exposure steps in these processes can be varied, see FIG. 1 for a comparison of the behaviour in matter of some of these types. In X-LIGA, synchrotron X-ray radiation is used to irradiate through high aspect ratio masks. Today's X-LIGA technology, while offering extremely accurate patterning capabilities, has a limited potential for industrial applications because of the high cost related to the exposure procedure and the manufacturing of masks. Furthermore, the depth of irradiation, i.e. the thickness of the structures, cannot be controlled. UV-LIGA, which uses UV light, is much cheaper and has a minimum feature size larger than 100 nanometers. Electron beams can be highly focussed and can produce very fine structures, well below 100 nm. However electrons are very light and therefore scatter easily in material which results in a loss of resolution at depth. Therefore only 2D structures can be made in shallow photoresist layers.

IB-LIGA (Ion Beam LIGA) has been developed as an alternative LIGA technique. It uses high energy (MeV) light ions, mostly protons, to irradiate photoresist materials; both positive and negative photoresist materials can be used. Masks can be used to obtain 2D patterns but the ion beam can also be collimated or focussed to use as a (maskless) direct-write tool. The height of structures can be controlled by the beam energy, e.g. from 14 µm to 160 µm in PMMA for a change in proton beam energy from 0.8 MeV to 3.5 MeV. Sloping (angled) structures can be obtained by varying the incidence angle of the ions. In this way, 3D structures can be obtained with high aspect ratios (up to 100) and sub micrometer lateral resolution. IB-LIGA is a very different technique from Focused Ion Beam (FIB) milling, which uses low energy heavy ions to sputter away surface atoms. FIB milling has a high spatial resolution but the sputter rate is very low which means that making high aspect ratio structures is very time consuming. The throughput of IB-LIGA is much higher than for FIB but much lower than for techniques using masks like X-LIGA and optical lithography. This makes IB-LIGA very suitable for small production runs and rapid prototyping but not for mass production of cheap components.

Moreover the above described techniques require that the substrate on which the structures must be obtained should be kept in a vacuum during irradiation. This limits the applicability of this technique in industrial productions.

In most irradiation devices, every target change implies an opening of the vacuum chamber, after which long pump-down times are required to attain the necessary level of vacuum.

To attenuate this shortcoming, an airlock may be used to introduce samples without breaking the vacuum in the irradiation chamber. An airlock suitable for the required vacuum level is however a complex and delicate piece of equipment, and must be equipped of additional vacuum pumps. Moreover the alignment of the sample is more difficult with an airlock.

Another possibility is to perform a batch of irradiation on several samples placed on a revolver or on a similar conveyer. This technique however requires the addition of a complex and large moving equipment within the vacuum chamber, and is also subject to alignment difficulties. Moreover the revolver system is only suitable for batches of limited size, and does not allow continuous production.

A common shortcoming of the techniques in which the sample is kept in a vacuum is the difficulty of dissipating the heat produced by the beam's energy lost in the sample and, where present, in the irradiation mask. When a high irradiation current is required, the sample and the mask may be damaged or deformed because of the temperature rise.

It is also known that the surface of a substrate can be structured by directing a low-energy ion beam thereupon, in presence of a suitable reactive process gas. For this method, known as Reactive Ion Etching (RIE) the energy of the involved ions is generally rather low.

BRIEF DESCRIPTION OF THE INVENTION

The aim of the present invention is to provide a process and a system for producing miniaturized three dimensional structures or for altering material's properties by an ion beam irradiation which is free from the above shortcomings.

The above object is provided by the process, systems and products according to the appended claims.

In particular the present invention permits the modification of materials in the interior, and the creation of buried three-dimensional structures. The invention exploits ionising radiation, and in particular high-energy ion beams to achieve new processes, systems and products in various fields.

The invention can be applied to 3D Micromachining process, system and product in which penetrating radiation is used for creating 3D buried structures. Another application of the present invention is the irradiation with ion in combination with reactive agents, either introduced by means of a process gas surrounding the target, or internally contained in the material. In this way the target material can be directly etched or its properties can be modified.

The device of the invention can also be used in air or in a suitable atmosphere to maximize heat dissipation for both structuring and modification and can be used in combination with a mask to increase throughput.

Complex 3D sub-surface structures can be obtained by exploiting the fact that ions deposit most energy per unit length towards the end of their path, which is well defined. In this way buried microcavities can be made in one step without using a two-layer process, laminating, gluing or cutting techniques. Similar results, albeit with some limitation, can be obtained by using slanted beams or by rotating the sample for concentrating the deposited energy within a buried region of said material.

The creation of three-dimensional structures within a material by the present invention comprises of course the creation of hollow features, by direct radiation milling or via a subsequent development step, but also the local alteration, according to a defined 3D pattern, of a specific property of a photo-sensitive material.

The present invention may therefore be used to improve the wettability or the biocompatibility of appropriate materials, to record information by altering some optical or magnetic or thermal property of the material, to provide components for optical or magnetic applications, or to locally promote chemical or biological reaction thanks to the activation of some appropriate chemical.

BRIEF DESCRIPTION OF THE FIGURES

FIG. 5 global view of the cavities obtained with the process of the present invention. The horizontal displacement of the sample is clearly visible, from the edge to the centre of the sample.

FIG. 6: a close-up view of the cavities of FIG. 5

FIG. 7: Calculated protons trajectories in the sample treated according to one aspect of the present invention.

FIG. 9: schematic diagram of an irradiation device for irradiating a sample in air or in a process gas according to a further aspect of the present invention.

DETAILED DESCRIPTION OF THE INVENTION

Figure 1:
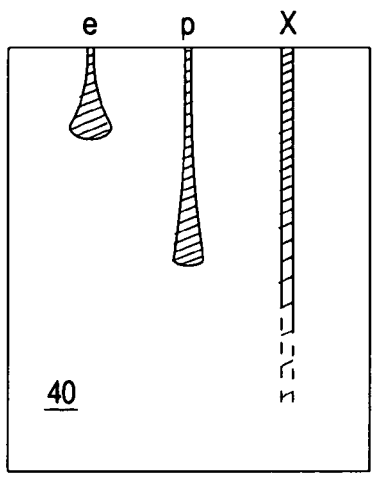
FIG. 1: Beam profile of three types of radiation when traversing matter. e: electron beam, p: high energy proton beam, X: X-ray radiation.

The process of making structures using IB-LIGA contains three steps:

Obtaining a layer of photo-resist.
Irradiation the photo-resist material with an ion beam.
Developing the irradiated structure
A possible final step is galvanising the structures to obtain negatives in more durable form. These steps are discussed in more detail hereafter.

There are many photo-resist materials available and there are also many criteria which have to be satisfied. One of these criteria is the type: positive or negative. In positive photo-resist, molecular bonds are broken (chain scission) by irradiation with particles or light after which the irradiated structure can be removed. In negative photo-resist, additional bonds are formed during irradiation (cross-linking) which makes the irradiated structures more durable so that development removes everything else PMMA has been chosen for the first tests because it has good characteristics, it is widely used and therefore easily available in a variety of forms. Currently we are using 3 mm thick sheets of commercially available high molecular weight PMMA (Röhm GS 233) which is synthesised at ambient temperatures to reduce the amount of internal stress.

A 3.5 MV single ended Van de Graaff accelerator is used for the irradiation of the photo-resist material. This machine can produce proton or $He^+$ ions with an energy between 0.8 and 3.5 MeV with an energy resolution of about 0.01%. The ion beam is guided through a vacuum tube to the target chamber which is also kept under vacuum. For the present results, the beam is collimated by slits at the entrance of the target chamber. The slits consist of cylinders made of tungsten carbide (WC) of 3 mm diameter. This design is made to minimise slit scattering. There are three sizes of collimator but in most cases the 0.2×0.2 mm² collimator was used. The range of the ions in PMMA is controlled by the beam energy and the sample can be rotated to change the angle of incidence of the ions. Either static irradiations can be made or the sample can be moved by computer controlled motors to obtain more complex structures. A crucial parameter for the irradiation is the dose, i.e. the number of ions per $mm^2$. The most reliable method of measuring the ion current density (ions/$mm^2$/s) is the use of a Faraday cup at the end of the set-up to measure the current of a well collimated ion-beam with known beam-size. However, this method cannot be used during irradiation because the ion beam is stopped in the sample and the Faraday cup is located behind the sample. Therefore the beam current is measured before and after the irradiation and the average used. This method only introduces a small uncertainty (about 5%) because the beam current proved stable enough. The total dose can be obtained by dividing the beam current by the beam area and multiplying by the time of irradiation. In case the sample is moving, the irradiation time is determined by the speed of the movement.

The general procedure for development is derived from the indications which can be found in literature [S. V. Springham, et al, Nucl. Instr. and Meth. B 130 (1997) 155]. It should be noted that one of the components of the development solution is susceptible to breakdown by light and therefore should be stored in the dark.

Several instruments have been used to make observations and measurements. The simplest instrument is the optical microscope (Leica DMLM). However, the contrast and magnification are insufficient for detailed observations. The SEM at EI·AJ (Cambridge Instruments stereoscan 90) proved much more useful. Before the observations, the PMMA samples have to be coated with a thin gold layer to improve contrast. However, only relatively small magnifications can be used up to 1500×. For higher magnifications, the electron beam becomes to intense causing damage to the PMMA. The Alphastep 500 of EI·AJ has been used to measure thicknesses (depth of structures) and surface roughness. For the latest measurements an Altisurf 500, also available at EI·AJ, has been used. This system uses a focussed white light beam (beam spot 3 µm) to measure the surface roughness down to a resolution of about 10 nm. The AFM at CSEM, Neuchâtel, has also been used to measure surface roughness at very small scales.

According to this aspect of the invention, irradiation tests have been performed on PMMA. Several series of irradiations have been performed to optimise irradiation parameters like dose and development parameters. The optimum value of the dose as a function of beam energy and current density had to be ascertained by performing a series of irradiations with different doses. The irradiations with a collimator need a dose range which is about the same as the accuracy of the dose measurement, e.g. 75-85 nC/$cm^2$ for 2 MeV protons.

Figure 2A:
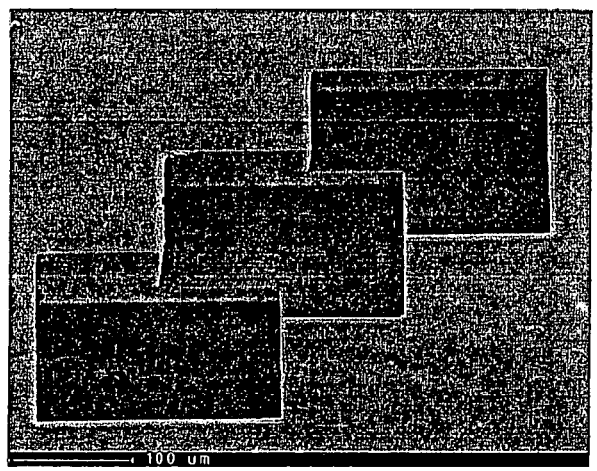
FIGS. 2a and 2b: Some results showing the effects of varying irradiation parameters according to the present invention. Left: SEM photograph of three irradiations with beam energies of, from left to right, 2.5, 2, and 1.5 MeV. Right: SEM photograph of a pyramid of about 25×25×50 µm³ produced in PMMA by tilting the sample 20° left and right, displacing the sample and repeating the tilting left and right.
Figure 2B:
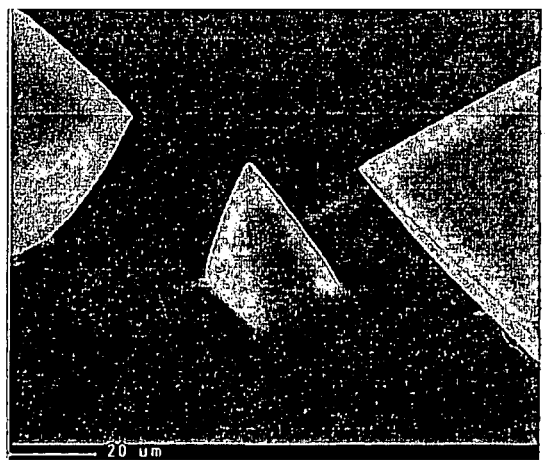

Some of the results showing the effects of varying irradiation parameters and sample movement are shown in FIGS. 2 and 3. The effect of the different energies on the depth can be clearly seen in FIG. 2 left. The depth of the structures has been measured with the Alphastep for structures made with 1.2 MeV and 2 MeV protons. The measured height is 28 µm and 65 µm respectively. The range of ions in matter can be calculated with one of the software packages available for this purpose, for example the well known program SRIM-2000. The calculated range is 26 µm and 61 µm for 1.2 MeV and 2 MeV protons respectively. These values are in reasonable agreement. It should be noted that to obtain a thickness in µm from the calculation a sample density is needed. However, the density is not known precisely which can already explain a large part of the difference. FIG. 7 report an example of range made with a suitable simulation software.

Figure 3A:
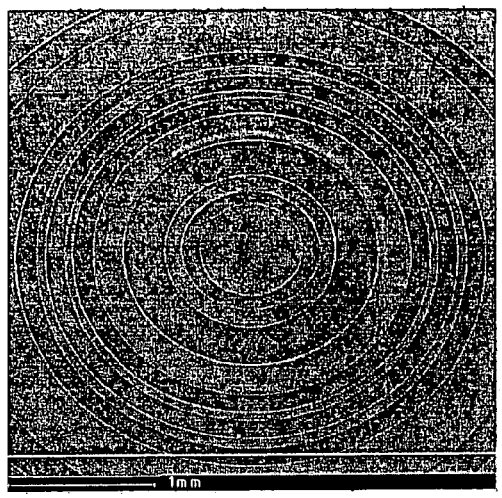
FIG. 3a to 3d: SEM photographs of some results showing the effects of sample movement according to the present invention. All irradiations have been performed with 2 MeV protons on PMMA. 3a: Rotation of the sample using different distances between the beam position and the rotation centre. 3b: Line scans on the edge of the PMMA. Each scan is made with a different dose after which the sample is displaced perpendicular to the scan movement. 3c: Structures left standing after performing two sets of line scans at perpendicular angles. 3d: Structure obtained by moving the sample in two squares with different sizes.
Figure 3B:
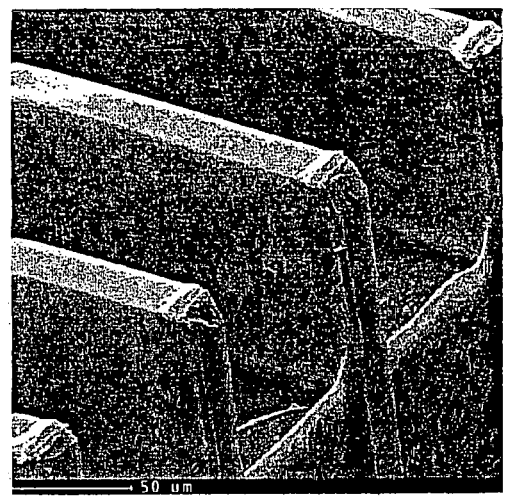
Figure 3C:
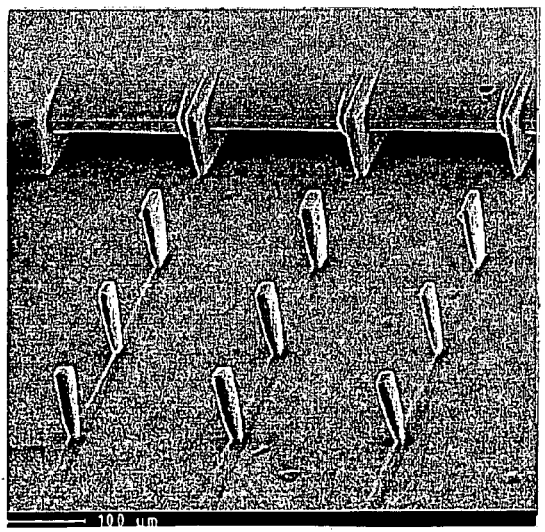
Figure 3D:
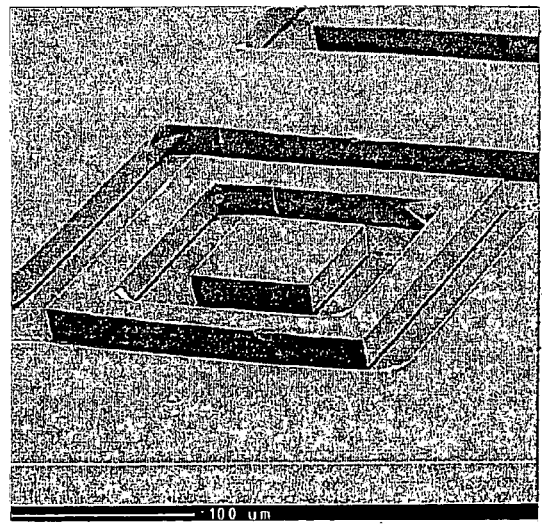

Problems of development arise at the end of the scan or at direction changes (corners) when moving the sample, as can be seen in the FIGS. 3c and 3d. The structure remains underdeveloped at these points because the irradiation dose remains too low. The overhangs visible in FIG. 3c are caused by the fact that the maximum energy transfer takes place close to the end of the range of the ions. This means that even with too low a dose, the bottom part still partially develops while the region closer to the surface does not develop. This leaves an overhang which becomes larger closer to the edge. Making an extra static irradiation at the end of a line scan does not solve the problem because this will result in a partial overdose which causes damage (holes) to the bottom surface. The best solution is minimising the number of end-points in a structure.

In FIG. 3c the undercut at the bottom of the structure can also be clearly seen. This is caused by the deviation of the ions from a straight line at very low energies. At low energies the ions are more likely to undergo small angle scattering which causes this beam broadening. The beam broadening can be modelled with the Monte-Carlo simulation program SRIM-2000 mentioned above. Comparing these calculations with experiment is not very useful because the accuracy of the modelling at low energies is limited and it is difficult to obtain experimental values. This undercut becomes more severe for higher beam energies. It can be eliminated by using a layer of photoresist material on a non-photoresist substrate, e.g. Si. The layer thickness should be smaller than about ⅔ of the range of the ions in the photoresist material. A different substrate can be used without risk because the probability for backscattering from within the substrate is very low. Furthermore, the dose needed for the photoresist material is so low that the damage to a non-resist substrate is negligible.

Walls with high aspect ratios can be made by moving the line scans closer together. When the scans are made too close together, the undercut will make a hole in the bottom of the wall. The best result obtained so far is a wall of 3 µm thick and 120 µm high, i.e. an aspect ratio of 40. This result has been obtained with a microbeam of 3 MeV protons. The aspect ratio can be further increased using a finite layer thickness of photoresist to eliminate the undercut.

Alternatively, higher aspect ratio can be obtained by means of multiple cycles ion beam exposition and development on top of each other. In this way the depth of treatment can be extended without limit.

Roughness measurements have been carried out by AFM for roughness with a small periodicity and by Altisurf for a long range surface (150 µm) with a minimum feature size of a few micrometer. Both type of measurements showed that the $R_A$ value is about 10 nm for the bottom as well as for the wall side.

The present invention is not of course limited to the use of the above mentioned Van de Graaf ion source, but any source of penetrating radiation or high-energy ions could be used together with any set-up for focussing ions or radiation. In particular with a microbeam facility the ion beam is focussed on the target with a magnetic lens system consisting of a quadrupole triplet. The beam can be scanned (moved) in an arbitrary pattern over the sample by use of magnetic scan coils within a scan area of 2.5×2.5 $mm^2$. Alternatively, the sample can be moved. The sample is mounted on a 3-axis motorised manipulator with a total area of movement of 100×25 mm². During the first tests already a beam size of about 1×1 µm² has been achieved. According to a further aspect of the invention, we present the structuration of microcavities with ion beam without cutting or opening the material using the fact that the energy deposition by protons in matter is not linear with the depth of penetration.

Figure 4:
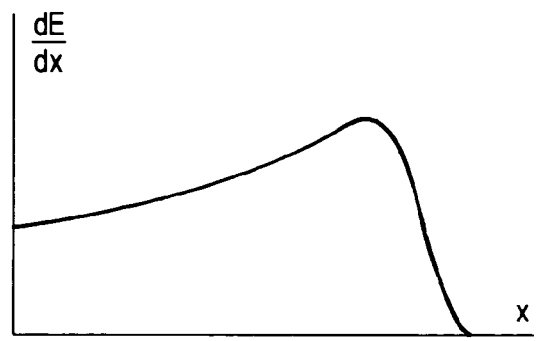
FIG. 4: plot of the stopping power dE/dx versus the penetration depth of accelerated ions in matter. The particle is much more ionizing at the end of its path.

The way a particle deposits its energy in the matter is different if it is a photon, an electron, a proton or a heavy particle. For charged particles, more energy per unit length will be deposited towards the end of its path rather than at its beginning, as shown in FIGS. 4 and 7. The stopping power for ions increases along the ion path, so that the density of deposed energy is maximal at path's end.

We exploited this effect to structure our cavities: by giving an adequate energy to protons, they deposit much of their energy in a precise depth, inducing less damage to the upper level which is thus much less developable and remains.

In this example a Van-de-Graaf accelerator has been used, which produces and accelerates protons ($H^+$) or helions ($He^+$) with energies from 0.8 up to 3.5 MeV with a energy resolution of 0.01%. The beam then passed by an analysis magnet with which the correct energy is selected, a directional magnet which direct the ions to one of the three lines. The beam is then focalized with a quadrupole magnet and enters the target chamber being collimated by slits of 3 mm diameter made of tungsten carbide (WC). The final collimation is made by a 100×100 µm collimating slit. The dose given to the sample is calculated by measuring the current density [ions/mm²/s] with a Faraday cup, knowing the surface of the beam and the time of irradiation (or the speed of displacement of the sample).

The lithography processes comprises the following steps:
irradiation of the sample (either with or without mask);
development (either wet or dry etching);
control and imaging of the obtained structures.

High molecular weight PMMA (polymethylmethacrylate) samples (Angst+Pfister PMMA-XT 01.2410.4020, 18×10×2 mm) were fixed on an x-y table inside the chamber. The ion energy was chosen to be at 2.7 MeV. The measured current density was 20 nA/mm² and the speed of displacement of the table 27 µm/s, giving a total dose of 75 nC/mm². The sample were developed for 90 minutes at 37° C. using a standard chemistry known as GG-developer and whose description can be found in the scientific literature [S. V. Springham, et al, Nucl. Instr. and Meth. B 130 (1997) 155] (ether monobutyl diethylenelycol, morpholine, ethalonamine and water).

An advantageous aspect of the process of the invention is that it can be implemented as a maskless process. By controlling the movements of the XY table, and by modulating the energy and the intensity of the ion beam it is possible to write in a three-dimensional fashion the desired structure in the bulk of the substrate. This means that the desired dose profile can be precisely deposited along a predetermined pattern in X, Y and Z, where Z corresponds to the depth in the material, determined by the beam's energy and by the ionic species used, and X and Y are determined by the movements of the XY table.

To observe the quality of the cavities, a SEM (Cambridge Instruments Stereoscan 90) was used. Prior to use this instrument, the dielectric PMMA sample has to be coated with a thin layer of gold (~100 nm) using a dc-sputtering machine.

Several tests were performed before finding the adequate dose. The PMMA sample, fixed on the x-y table, was positioned properly close to the beam and then moved across with a constant speed. A global view of a resulting structure is shown in FIG. 5. The five structures of this group received the same dose (~75 nC/mm²) which proved to be the best value to obtain reliable cavities. On this sample, a few tests made to calibrate the parameters of exposition were made but are not visible on the picture.

Using SRIM program, we calculated the protons penetration depth knowing their initial kinetic energy of 2.7 MeV and obtained 110 µm: this value seems to be correct if we look at the depth of the cavities which is about 120 µm. The cavity itself has the following dimensions: 0.1×0.07×1 mm.

A 300× magnified picture is presented in FIG. 6. The surface quality of the cavity edges is optically very good. the surface was also developed but the top layer is still thick enough (~50 µm). The angled slope at the end of the course is due to the characteristic dose profile. When scanning a line the beginning and end of the path do not receive the same dose because the exposure time of the first and last irradiated parts is less. The bottom surface undercut is due to the dispersion of the protons path.

The 2.7 MeV proton trajectories in the PMMA, simulated with SRIM, are depicted in FIG. 7. Their dispersion d along the y-axis at the end of their path leads to an undercut described in FIG. 6.

This aspect of the invention is not however limited to the above ion energies and atomic species, which are given by way of example only. In particular the method of the invention could make use of a generic ionic species, according to the dose profile desired, and in particular of all light ions species, and in particular of ions of the species H, He, Li, Be, B, C, N, O, F, Ne.

The energy of 2.7 MeV is also given here by way of example, and it is to be understood that the method of the invention could make use of any beam energy, according to the circumstances, and in particular of energies comprised between 0.5 MeV/amu and 8 MeV/amu, and more in particular of ionic beams whose energy is comprised between 1 MeV/amu and 3 MeV/amu.

With this way of fabrication, a great potential exists to structure cavities in materials without using two-layers, laminating or cutting techniques. By selecting the ion energy and using a high-precision x-y table, the form, depth and dimensions of so-called "microtunnels" can be precisely controlled thus opening a door to a new technology applied especially in the growing field of microfluidics.

The method of the invention allows therefore obtaining complex three-dimensional structures in the bulk of the material, without requiring additional gluing, aligning, bonding or assembly steps. In this way the structure can be obtained in a more economical way and is more robust.

Figure 8:
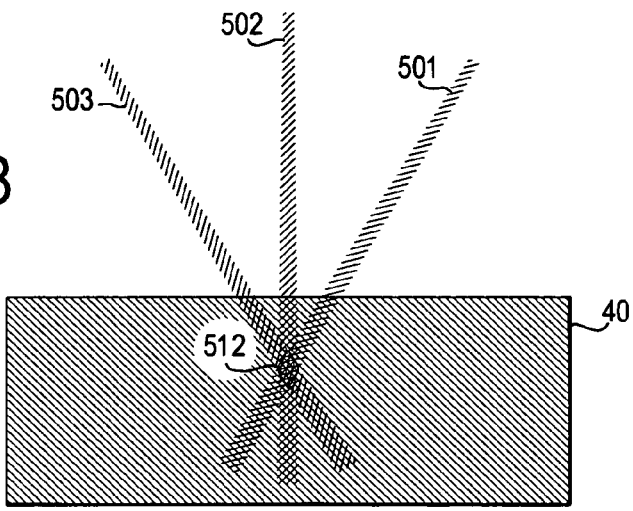
FIG. 8: schematic diagram illustrating an exposure according to an aspect of the present invention

The above aspects of the invention exploited the fact that the dose deposited in a material by a beam of charged particles is higher at the end of the range. The same effect of concentrating the dose within a buried region of the material to be structured could however also be achieved by exposing the material do a series of converging beams 501, 502, 503, crossing themselves in the region 512 where the structuring effect is desired (FIG. 8).

This way of proceeding can be done by sending several slanted or inclined beams 501, 502, 503, to the target at the same time or, more simply, by delivering the desired integrated dose in several passes performed at different inclination and spaced in time.

This technique of converging beams allows using also neutral beams or photon beams, hard X-rays beams or photon beams generated by synchrotron radiation wherein the dose-enhancement at the end of the path is less than in charged particles' beams. The beam energy required for the process according to this aspect of the invention will necessarily vary, according to the energy deposition distribution searched. Typically the energies will be in the same ranges described above for ion and light ion beams. When ions beams are used in combination with the inclined beam technique an even higher dose concentration can be achieved in the desired region.

According to another aspect of the invention, an ion beam of characteristics analogous to those described above is applied to a sample of PTFE. In this case structuring of the material can be obtained directly and without the need of a developing step. The geometries achieved are analogous to those obtainable in PMMA.

Other materials, whose structure can be modified by the irradiation with ion beams, in particular polymers which are susceptible to molecular scission or cross-linking under irradiation, may be directly structured by this technique.

A further aspect of the invention concerns the possibility to use an ion beam to modify the optical or the magnetic properties of a substrate. For example it is possible to induce local refraction index variations high enough to give rise to an optical guide or to an optical circuit. At the same time magnetic patterns can be written in a buried layer of material by altering the magnetic properties according to a predetermined three-dimensional pattern.

A further aspect of the invention, now described with reference to FIG. 9, concerns the possibility of irradiating a substrate at atmospheric pressure. according to this aspect of the invention an ion beam generator 32 comprises an evacuated space 33 into which is placed an ion accelerator 45 generating a collimated ion beam 80 having the required composition, intensity and energy. A deflection unit 47 bends the beam 80, electrically or magnetically in order to sweep the surface of the target substrate 40 according to a predetermined pattern. An exit window 37 is installed at the output end of the generator, and the substrate 40 is placed behind. The ion beam 80 crosses the window 37 and impinges on the target substrate 40 which is placed in a volume at atmospheric pressure 31.

The window may comprise a kapton or aluminium sheet with a thickness comprised between 5 and 10 micrometers. This implies an energy loss of the order of 50-150 keV for ion beams whose energy and composition is comprised within the limits specified above, for example for an energy comprised between 2 and 6 MeV, preferably between 3 and 5 MeV.

Of course many materials lend themselves to the construction of the exit window, mylar and aluminium representing only two current possible choices. Other alternatives, likes windows of carbon, silicon nitride, or other light materials are perfectly possible and bay be adopted within the frame of the present invention.

Additionally, it is clear that the constitution of the ion beam generator 32 is not limited to the simplified structure given here by way of example, but may also comprise various additional pieces of known equipment, like deflectors, collimators, filters or ion sources, according to the circumstances.

The distance between the window and the substrate will preferably be kept as small as possible, in order to minimize energy loss and multiple scattering in air, compatibly with the necessity of cooling target and window. Typically a distance of about 1-2 mm or less is adopted, however in some cases the target substrate may be in contact with the window.

In order to further decrease the multiple scattering in air, and to promote heat dissipation, a flow of a light gas, like $H_2$ or He, may be forced in the space between the window and the target.

Also, the space surrounding the target may be filled by a suitable chemically active gas, in order to assist the ablation of the substrate material. It is observed that, for example in Si target in presence of a fluorinated process gas, the high-energy ions turn a part of the target into an amorphous state, which is readily etched.

The present invention is not limited to the maskless, direct-write techniques described above, but includes also process in which the selective exposition of the substrate is obtained by a suitable mask opaque to the ions.

In this case the mask could also be in the air space between the window and the target, which provides the simplest and most versatile disposition. However, the mask could also be placed in the vacuum space before the window, or a sheet of variable thickness could be used, combining the functions of mask and exit window.

Figure 10:
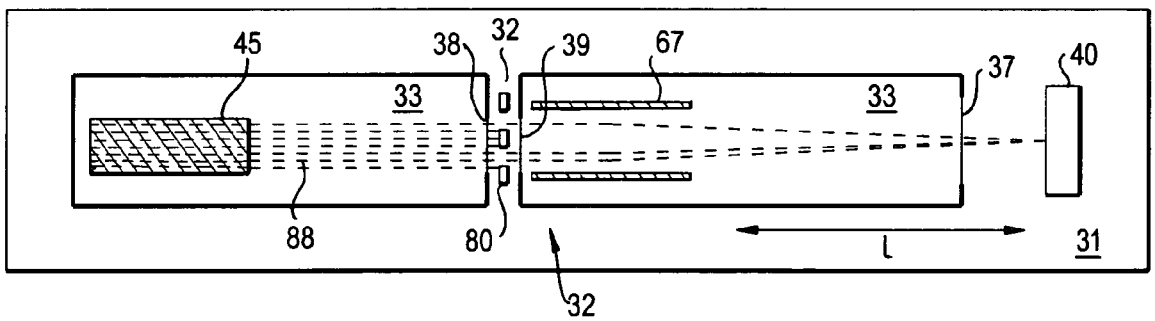
FIG. 10: schematic diagram of an irradiation device for irradiating a sample in air or in a process gas according yet another aspect of the invention.

When a very high space resolution is required, an ion optics may be employed to de-magnify the mask, and project on the substrate down scaled image of the original mask, as it is shown on FIG. 10. According to this aspect of the invention, the ion beam 88 is formed in a broad parallel pencil, for example, and directed to the mask 80, where it is selectively absorbed, in order to obtain the desired exposition pattern. A ion focussing device 67 project on the target substrate 40 a dimensionally reduced image of the mask 80. A certain focal length l is required for obtain the required dimensional reduction.

Figure 11:
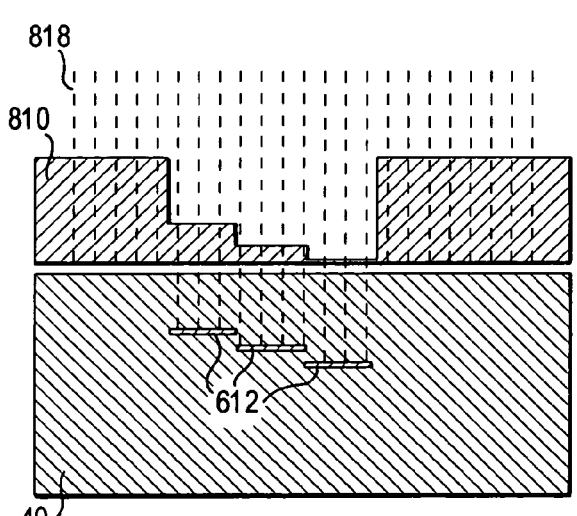
FIG. 11: cross-cut of an irradiation according to a further aspect of the present invention.

In this case the mask may be in the vacuum chamber 33, or, preferably, in an airspace 32, separated by two windows 28, 29 from the vacuum chamber 33, as on FIG. 11.

Although IB lithography is a major application area of the present invention, this is not limited to structuring and engraving applications, but encloses other surface and bulk treatments which can be obtained by means of an ion beam as well.

For example, the system and method of the invention may be employed for ion milling, surface hardening, and surface wettability modifications. Ion irradiation may also be used for improving the biocompatibility of materials, or for engraving nanopores on polymer membranes.

Further the method and the apparatus of the present invention may be employed with living cells or living tissues as targets. In this case the energy deposited in the target may activate a radiation-sensitive chemical, according to a well-defined three dimensional pattern.

Even if some of the above applications are per se known, it will be appreciated that the system and method of the invention, allowing the treatment of samples in air, permits the application of such treatments in a more practical and economical way to a variety of products.

Figure 12:
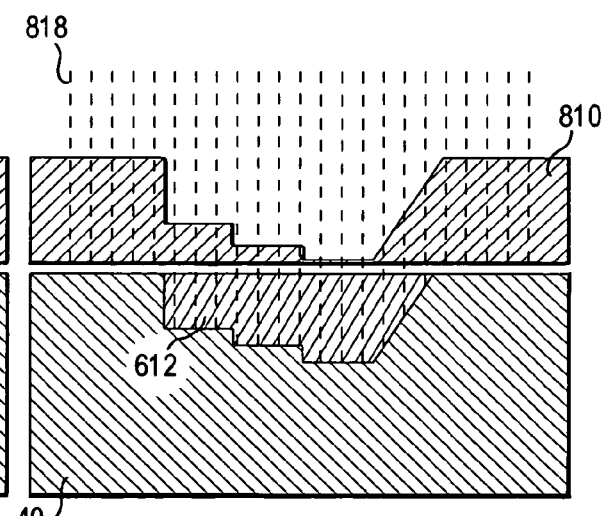
FIG. 12: cross-cut of an irradiation similar to that of FIG. 11 in which an open structure with slanted features is obtained.

A further embodiment of the present invention will be now described, with reference to FIGS. 11 and 12. According to this embodiment the radiation beam, for example a proton or helium ion beam having the features of the above embodiments, crosses a mask 810 before hitting the target 40. The mask 810 introduces a variable energy loss in the radiation beam, according for example to a variable thickness of the mask, as depicted in FIG. 11.

Thanks to the interposition of the mask 810 the energy of the beam hitting the target 40 will vary according to the energy which is lost in the mask 810. Thank to this feature the energy will be deposited in the bulk of the substrate 40 at a variable depth, in the region 612 of FIG. 11. This embodiment allows therefore the creation of multilevel 3D structures, comprising buried features 612 at different depths.

The thickness of the mask can vary stepwise, as illustrated, or also in a continuous fashion. In the latter case the depth of the corresponding features in the target 40 will also vary continuously, which allows the creation of slanted structures, as depicted in FIG. 12.

The variability of the energy, and therefore of the depth of the resulting structures, can be advantageously obtained by a variable-thickness mask, as illustrated. However it would also be possible, within the frame of the present invention, to use a composite mask comprising material of varying density, or varying dE/dx coefficient, to arrive at the same result.

The mask 810 in FIGS. 11 and 12 can be used in two modes: static or dynamic. In the static mode, the mask is placed on the substrate 40 or placed in a fixed position relative to the substrate. The mask can be as large as the substrate and the mask and substrate is moved with respect to the beam to cover the hole area. In the dynamic mode, the mask is placed fixed with respect to the beam and the substrate can be moved behind it. In this case the pattern of the mask can be reproduced many times on the substrate.

The three-dimensional mask of varying thickness or variable energy loss, like mask 810, providing a variable energy loss, and defining a three-dimensional microstructure 810 can be used for ion implantation By opportunely varying the exposition and development condition, and in particular by increasing the delivered dose, open structures 613 can be obtained, as visible on FIG. 12. It will be appreciated that this method allows the creation of slanted structures.

In a variant, the radiation-sensitive material 40 consists in a photoresist material, for example a positive photoresist or a negative photoresist, and the irradiation is followed by a developing step for obtaining a 3D micro-structure corresponding to the 3D pattern of the energy deposition.

The method of the invention allows the realization of three-dimensional nanostructures and microstructures in all kind of materials 40, like for example:
 crystalline and amorphous diamond;
 crystalline and polycrystalline silicon;
 Oxides, in particular aluminium oxide $Al_2O_3$, (sapphire or ruby), zircon $Zr_2O_3$ and titanium oxide, and $TiO_2$;
 glass;
 ceramic materials, for example $TiO_2$ based ceramics;
 nitrides, in particular nitrides of aluminium, silicon, titanium and boron;
 carbides, notably carbides of silicon, boron and tungsten.

The above list is given by way of example only and the present invention is by no means limited to the above substrates, but is to be construed as encompassing all the suitable substrate materials, as well as all their combinations and compounds.

According to a further aspect, the invention deals with a process for creating a predetermined structure in a diamond substrate, the process comprising the steps of:
 directing a beam (818) of radiation to said diamond substrate,
 deposing energy by said beam (818) locally into said diamond substrate, according to a predetermined pattern,
 selectively removing those parts of the diamond substrate in which said energy has been deposited.

More particularly this aspect of the invention involves the delivery of a radiation dose sufficient for locally altering the crystalline carbon-carbon bonds in the diamond. The delivered dose may be sufficient, in embodiments of the invention, to cause partial or total transformation of the original diamond structure into a graphite structure or into another crystalline structure.

The selective removing of the irradiated parts of the diamond substrate may be carried out, in embodiments, by means of dry etching processes, for example an oxygen plasma etching, or by selective oxidation, or by a UV-induced ozone process, or eventually by a suitable wet etching product.

The radiation beam may be for example a beam of charged ions belonging to one of the following species: H; He; Li; Be; B; C; N; O, and whose energy is comprised between 1 keV and 10 MeV.

The local energy deposition in the diamond may be obtained by collimating the radiation beam on the diamond, by varying the direction and the point of incidence of the radiation beam with respect to the diamond substrate and/or by varying the penetration depth of the radiation by altering the beam energy, and may be done according to a predefined three-dimensional pattern at various penetration depths in the diamond. According to the necessity, the pattern of the local energy deposition may be defined by a mask, interposed in the radiation beam before it impinges on the diamond substrate.

In the latter case, the mask used for the definition of the pattern of local energy deposition may be a three-dimensional mask of varying thickness or variable energy loss, like mask 810, providing a variable energy loss, and defining a three-dimensional microstructure or nanostructure pattern within the diamond substrate.

The invention claimed is:

1. Process for creating a predetermined three-dimensional structure in the bulk of a radiation-sensitive material (40) comprising the steps of:
 directing a beam (818) of penetrating radiation to said radiation-sensitive material,
 providing a mask (810) introducing a space-variable energy loss, in said beam (818),
 deposing energy by said beam (818) locally into said bulk of said material (40) according to a predetermined three-dimensional pattern (612).

2. Process according to claim 1, whereas said energy deposited into said bulk of said material (40) is substantially higher than an energy deposited to an outer surface of said material.

3. Process according t claim 1, wherein said radiation energy is deposited by a radiation beam having a penetration range in which the deposited energy is sensibly higher towards the end of the penetration range.

4. Process according to the previous claim, wherein said radiation beam comprises charged ions.

5. Process according to the previous claim, wherein said charged ions belong to one of the following species: H; He; Li; Be; B; C; N; O.

6. Process according to claim 1, further comprising a development step for removing a predetermined portion of said material.

7. Process according to claim 1, wherein a predetermined portion of said material is evaporated or ablated without a development step.

8. Process according to claim 1, wherein a predetermined portion of the target is directly etched with the aid of a reactive component introduced in the material or in a gas surrounding said material, without need of a subsequent development step.

9. Process according to claim 1, wherein said predetermined three-dimensional structure comprises at least one internal channel.

10. Process according to claim 1, wherein the refractive index of a predetermined region of said material is altered by said radiation.

11. Process according to claim 1, wherein a magnetic or optic or thermal property of a predetermined region of said material are altered by said radiation.

12. Process according to claim 1, wherein the mask (810) has variable thickness.

13. Process according to claim 1, wherein the mask (810) comprises materials of variable dE/dx coefficient.

14. Process according to claim 1, wherein the energy loss in the mask (810) varies in such a way that the energy is deposited at variable depth in the bulk of the material (40).

15. Process according to the previous claim, wherein the energy loss in the mask (810) varies in such a way that the energy is deposited in the bulk of the material (40) according to a 3D structure.

16. Process according to claim 1, wherein the energy loss in the mask (810) varies stepwise.

17. Process according to claim 1, wherein the energy loss in the mask (810) varies in a continuous fashion in such a way that the energy is deposited in the bulk of the material (40) according to a slanted pattern.

18. Process according to claim 1, wherein the energy deposited in said bulk of said material (40) is substantially higher than energy deposited to an outer surface of said material, whereby said predetermined three-dimensional structure comprises at least one internal channel.

19. Process according to claim 1, wherein the delivered energy dose is chosen for obtaining an open structure.

20. Miniaturized device comprising a three-dimensional structure realizable by the process of one of the preceding claims.

21. Device according to the preceding claim, comprising at least one internal channel for micro- or nano-fluidic applications and/or for micro- or nano-gas flow applications.

22. Device according to claim 20, comprising a magnetizable structure.

23. Device according to claim 20, comprising a light guide structure.

24. Process for creating a predetermined three-dimensional structure in the bulk of a photoresist material, comprising the steps of:
   directing a beam (818) of penetrating radiation to said photoresist material,
   providing a mask (810) introducing a space-variable energy loss, in said beam (818),
   deposing energy by said beam (818) locally into said bulk of said material according to a predetermined three-dimensional pattern.

25. Process according to the previous claim, wherein said photoresist material is a negative photoresist material, and further comprising a step of developing said negative photoresist material for obtaining a three-dimensional microstructure corresponding to the three-dimensional pattern of energy deposited in the photoresist material.

26. Process for creating a predetermined structure in a diamond substrate, the process comprising the steps of:
   directing a beam (818) of radiation to said diamond substrate,
   deposing energy by said beam (818) locally into said diamond substrate, according to a predetermined pattern,
   selectively removing those parts of the diamond substrate in which said energy has been deposited.

* * * * *